United States Patent [19]
Hause et al.

[11] Patent Number: 5,930,634
[45] Date of Patent: Jul. 27, 1999

[54] METHOD OF MAKING AN IGFET WITH A MULTILEVEL GATE

[75] Inventors: Frederick N. Hause; Robert Dawson; H. Jim Fulford, Jr., all of Austin; Mark I. Gardner; Mark W. Michael, both of Cedar Creek; Bradley T. Moore; Derick J. Wristers, both of Austin, all of Tex.

[73] Assignee: Advanced Micro Devices, Inc., Sunnyvale, Calif.

[21] Appl. No.: 08/844,927

[22] Filed: Apr. 21, 1997

[51] Int. Cl.$^6$ .................................................. H01L 21/336
[52] U.S. Cl. .............................. 438/307; 438/592
[58] Field of Search ..................... 438/592, 307, 438/305

[56] References Cited

U.S. PATENT DOCUMENTS

| | | |
|---|---|---|
| 4,514,233 | 4/1985 | Kawabuchi . |
| 4,584,760 | 4/1986 | Okazawa . |
| 5,061,647 | 10/1991 | Roth et al. . |
| 5,304,504 | 4/1994 | Wei et al. .................................. 437/44 |
| 5,457,060 | 10/1995 | Chang ........................................ 437/34 |
| 5,464,784 | 11/1995 | Crisenza et al. . |
| 5,512,506 | 4/1996 | Chang et al. ............................. 437/44 |
| 5,656,519 | 8/1997 | Mogami .................................. 438/303 |
| 5,780,349 | 7/1998 | Naem ...................................... 438/305 |
| 5,814,543 | 9/1998 | Nishimoto et al. ..................... 438/264 |
| 5,851,891 | 12/1998 | Dawson et al. ......................... 438/305 |

*Primary Examiner*—Richard A Booth
*Attorney, Agent, or Firm*—Skjerven, Morrill, MacPherson, Franklin & Friel, L.L.P.

[57] ABSTRACT

A method of making an IGFET with a multilevel gate that includes upper and lower gate levels is disclosed. The method includes providing a semiconductor substrate with an active region, forming a gate insulator on the active region, forming a first gate material with a thickness of at most 1000 angstroms on the gate inslator and over the active region, forming a first photoresist layer over the first gate material, irradiating the first photoresist layer with a first image pattern and removing irradiated portions of the first photoresist layer to provide openings above the active region, etching the first gate material through the openings in the first photoresist layer using the first photoresist layer as an etch mask for a portion of the first gate material that forms a lower gate level, removing the first photoresist layer, forming an upper gate level on the lower gate level after removing the first photoresist layer, and forming a source and drain in the active region. Advantageously, the first photoresist layer can be ultra-thin to enhance the accuracy in which the image pattern is replicated, thereby reducing variations in channel length and device performance.

48 Claims, 10 Drawing Sheets

METHOD OF MAKING AN IGFET WITH A MULTILEVEL GATE

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to sidewalls of the gate. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. After the source and drain are doped, the implanted dopants are driven-in and activated using a high-temperature anneal that would otherwise melt the aluminum.

Photolithography is frequently used to create patterns that define where the polysilicon layer is etched. Typically, the wafer is cleaned and prebaked to drive off moisture and promote adhesion, an adhesion promoter is deposited on the wafer, a few milliliters of positive photoresist are deposited onto the spinning wafer to provide a uniform layer, the photoresist is soft baked to drive off excess solvents, the photoresist is irradiated with an image pattern that renders selected portions of the photoresist soluble, a developer removes the irradiated portions of the photoresist, an optional de-scum removes very small quantities of photoresist in unwanted areas, the photoresist is hard baked to remove residual solvents and improve adhesion and etch resistance, the etch is applied using the photoresist as an etch mask, and the photoresist is stripped. Therefore, the photoresist has the primary functions of replicating the image pattern and protecting the underlying polysilicon when etching occurs.

Increasing the photoresist thickness generally decreases the accuracy in which the photoresist replicates the image pattern. For instance, variations in photoresist thickness can result in changes in photoresist linewidth, and increasing the photoresist thickness often leads to larger variations in the photoresist thickness. Furthermore, the image pattern generates standing waves caused by actinic light waves that propagate through the photoresist down to the polysilicon and reflect off the polysilicon back through the photoresist. The reflected waves constructively and destructively interfere with the incident waves to create zones of high and low exposure with a separation of $(\lambda/4n)$, where $\lambda$ is the wavelength of the image pattern and $n$ is the index of refraction of the photoresist. Standing waves are disadvantageous because the periodic variation of light intensity in the photoresist causes the photoresist to receive nonuniform doses of energy through the layer thickness. Increasing the photoresist thickness tends to increase the problems associated with standing waves.

Although the photoresist is eroded by the etch, the photoresist must be thick enough to avoid being removed by the etch. The minimum thickness of the photoresist depends on the selectivity of the etch with respect to the photoresist, the selectivity of the etch with respect to the polysilicon, and the thickness of the polysilicon. In general, the etch is highly anisotropic and forms the gate with vertical sidewalls since tapered sidewalls might affect the channel length. In addition, the etch is highly selective of polysilicon with respect to the underlying silicon dioxide. To meet these requirements, the etch typically utilizes etch gases containing both chlorine (such as $Cl_2$) and fluorine (such as $SF_6$). As a result, the photoresist is often on the order of 4 times as thick as the underlying polysilicon to assure that the etch does not remove the photoresist.

For submicron geometries, the gate thickness is usually on the order of 2000 to 2500 angstroms so that the gate provides an implant mask for the underlying channel region during ion implantation of the source and drain. Therefore, the photoresist that defines the gate needs a thickness on the order of 8000 to 10,000 angstroms. Unfortunately, at such thickness, the photoresist may not accurately replicate the image pattern due to variations in photoresist thickness, standing waves and the like. Moreover, variations in photoresist linewidth can lead to variations in gate length (the critical dimension), which in turn can lead to variations in channel length and ultimately device performance.

Accordingly, a need exists for an improved method of making an IGFET that includes photolithography yet reduces unwanted variations in channel length and device performance.

SUMMARY OF THE INVENTION

An object of the present invention is to provide an IGFET with a multilevel gate that includes upper and lower gate levels. Preferably, the lower gate level is at most 1000 angstroms thick. Advantageously, the lower gate level is formed using an ultra-thin photoresist layer that replicates an image pattern more accurately than thicker photoresist layers. Thereafter, the upper gate level is formed on the lower gate level.

In accordance with one aspect of the invention, a method of making an IGFET includes providing a semiconductor substrate with an active region, forming a gate insulator on the active region, forming a first gate material with a thickness of at most 1000 angstroms on the gate insulator and over the active region, forming a first photoresist layer over the first gate material, irradiating the first photoresist layer with a first image pattern and removing irradiated portions of the first photoresist layer to provide openings above the active region, etching the first gate material through the openings in the first photoresist layer using the first photoresist layer as an etch mask for a portion of the first gate material that forms a lower gate level, removing the first photoresist layer, forming an upper gate level on the lower gate level after removing the first photoresist layer, and forming a source and drain in the active region. Preferably, the first gate material is polysilicon with a thickness in the range of 500 to 1000 angstroms.

In a first embodiment, forming the upper gate level includes depositing a second gate material over the substrate and on the lower gate level, forming a second photoresist layer over the second gate material, irradiating the second photoresist layer with a second image pattern and removing irradiated portions of the second photoresist layer to provide openings above the active region, etching the second gate material through the openings in the second photoresist layer using the second photoresist layer as an etch mask for a portion of the second gate material that forms the upper gate level, and removing the second photoresist layer. Preferably, the first and second image patterns are essentially identical, the second gate material is substantially thicker than the first gate material, the second photoresist layer is substantially thicker than the first photoresist layer, and the second gate material is polysilicon or a conductive metal.

In a second embodiment, forming the upper gate level includes selectively depositing epitaxial silicon on the lower gate level.

In a third embodiment, forming the upper gate level includes depositing a refractory metal on the lower gate level, and applying an anneal to provide a metal silicide on the lower gate level.

In a fourth embodiment, forming the upper gate level includes depositing an insulating layer over the substrate and on the lower gate level, forming an trench partially through the insulating layer that exposes the lower gate level, and depositing a second gate material into the trench.

Preferably, lightly doped source and drain regions are implanted into the active region before forming the upper gate level. Implanting the lightly doped source and drain regions can include using either the lower gate level or the first photoresist layer as an implant mask. Alternatively, if desired, implanting the lightly doped source and drain regions can include implanting ions through the lower gate level into the active region so that the IGFET is a depletion-mode device.

A feature of the invention includes depositing an insulating layer over the substrate and on the lower gate level after removing the first photoresist layer, polishing the insulating layer until a top surface of the lower gate level is exposed, and then forming the upper gate level.

Another feature of the invention includes implanting lightly doped source and drain regions using the lower gate level as an implant mask, and implanting heavily doped source and drain regions using the upper gate level as an implant mask. Opposing sidewalls of the upper gate level extend laterally beyond opposing sidewalls of the lower gate level. In this manner, the upper gate level alone (without sidewall spacers) protects portions of the lightly doped source and drain regions from the implant step that forms the heavily doped source and drain regions.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
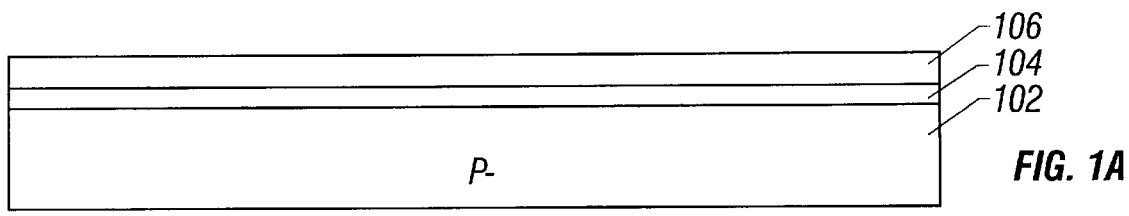
FIGS. 1A–1L show cross-sectional views of successive process steps for making an IGFET with a multilevel gate in accordance with a first embodiment of the invention.

In the drawings, depicted elements are not necessarily drawn to scale and like or similar elements may be designated by the same reference numeral throughout the several views.

FIGS. 1A–1L show cross-sectional views of successive process steps for making an IGFET with a multilevel gate in accordance with an embodiment of the invention.

In FIG. 1A, silicon substrate 102 suitable for integrated circuit manufacture is provided. Substrate 102 includes a P− type epitaxial surface layer with a planar top surface disposed on a P+base layer (not shown). The epitaxial surface layer provides an active region with a boron background concentration on the order of $1 \times 10^{15}$ atoms/cm$^3$, a <100> orientation and a resistivity of 12 ohm-cm. A blanket layer of gate oxide 104, composed of silicon dioxide ($SiO_2$), is formed on the top surface of substrate 102 using tube growth at a temperature of 700 to 1000° C. in an $O_2$ containing ambient. Gate oxide 104 has a thickness in the range of 30 to 100 angstroms. Thereafter, polysilicon layer 106 is deposited by low pressure chemical vapor deposition on the top surface of gate oxide 104. Polysilicon layer 106 is undoped and has a thickness of 500 angstroms. If desired, polysilicon layer 106 can be doped in situ as deposition occurs, or doped immediately after deposition by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that polysilicon layer 106 be doped during later processing steps.

Figure 1B:
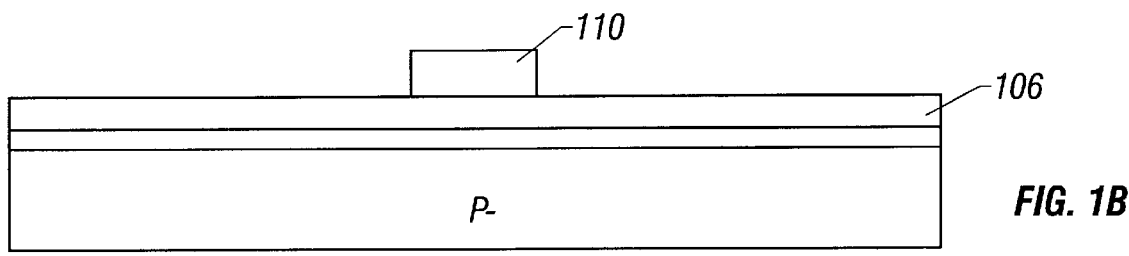

In FIG. 1B, photoresist layer 110 is deposited on polysilicon layer 106. Since polysilicon layer 106 has a thickness of only 500 angstroms, photoresist layer 110 has a thickness of merely 2000 angstroms. A photolithographic system, such as a step and repeat optical projection system which generates deep ultraviolet light from a mercury-vapor lamp, uses a first reticle to irradiate photoresist layer 110 with a first image pattern Thereafter, the irradiated portions of photoresist layer 110 are removed, and photoresist layer 110 includes openings above selected portions of the active region. Of importance, photoresist layer 110 is an ultra-thin layer that replicates the first image pattern with a high degree of accuracy.

Figure 1C:
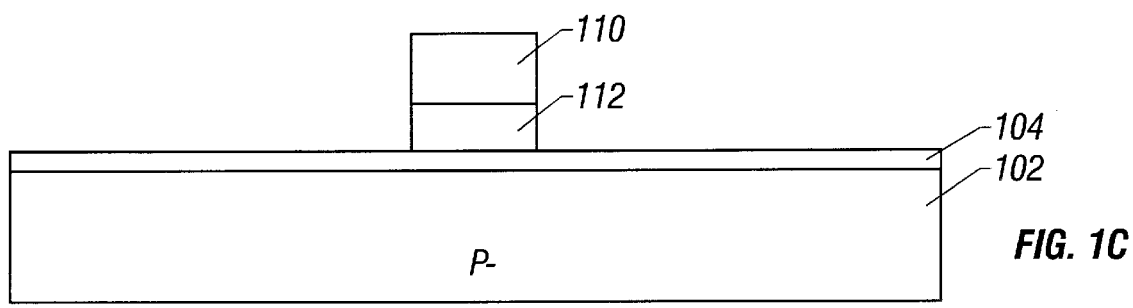

In FIG. 1C, an anisotropic dry etch is applied using photoresist layer 110 as an etch mask. Photoresist layer 110 protects the underlying regions of polysilicon layer 106, and the etch removes the regions of polysilicon layer 106 beneath the openings in photoresist layer 110. The etch is highly selective of polysilicon layer 106 with respect to gate oxide 104, so only a negligible amount of gate oxide 104 is removed and substrate 102 is unaffected. The etch forms polysilicon region 112 from the unetched portion of polysilicon layer 106 over the active region. Polysilicon region 112 includes opposing vertical edges (or sidewalls) separated by a length of 3500 angstroms, has a height (or thickness) of 500 angstroms, and provides a lower gate level of a multilevel gate.

Figure 1D:
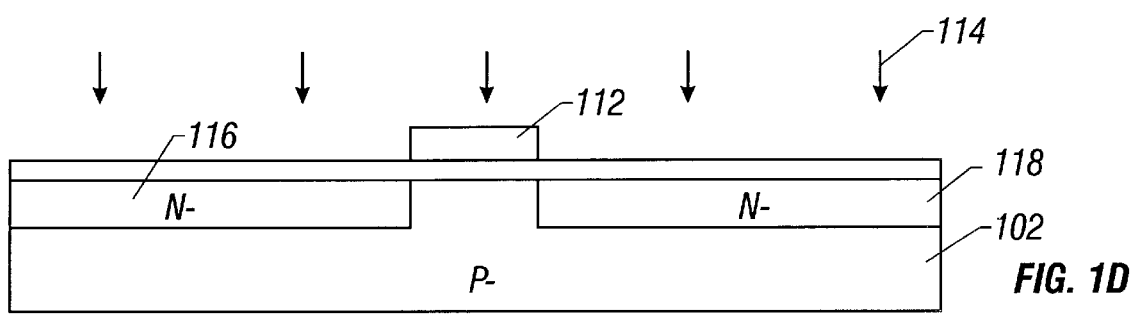

In FIG. 1D, photoresist layer 110 is stripped, and lightly doped source and drain regions are implanted into the active region by subjecting the structure to ion implantation of arsenic, indicated by arrows 114, at a dose in the range of $1 \times 10^{13}$ to $5 \times 10^{14}$ atoms/cm$^2$ and an energy in the range of 2 to 20 kiloelectron-volts, using polysilicon region 112 as an implant mask. As a result, lightly doped source/drain regions 116 and 118 are implanted into the active region and are self-aligned to the opposing vertical edges of polysilicon region 112. Lightly doped source/drain regions 116 and 118 are doped N– with an arsenic concentration in the range of about $1 \times 10^{17}$ to $1 \times 10^{18}$ atoms/cm$^3$ and a depth of about 100 to 300 angstroms.

Figure 1E:
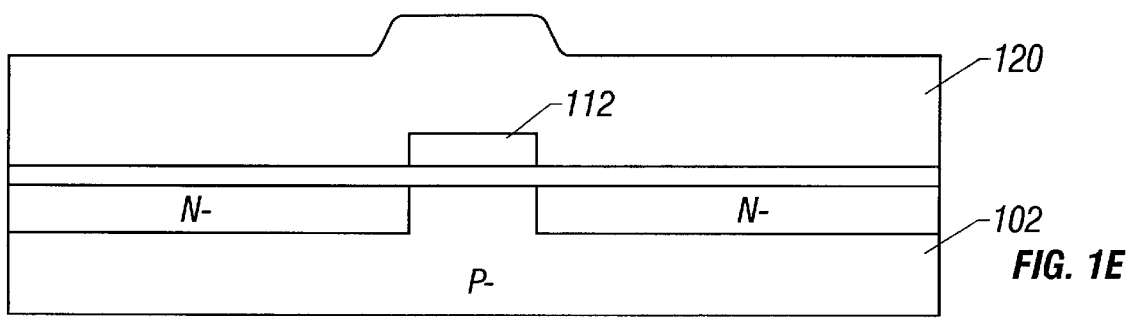

In FIG. 1E, a blanket layer of silicon dioxide is deposited by plasma enhanced chemical vapor deposition at a temperature in the range of 300 to 450° C. to form oxide layer 120 over substrate 102. Oxide layer 120 has a thickness of 1000 angstroms and covers polysilicon region 112.

Figure 1F:
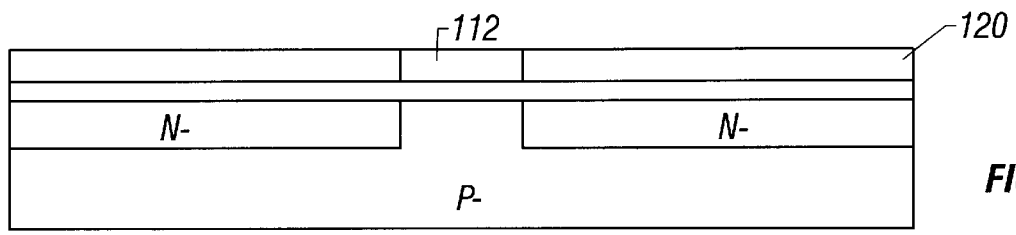

In FIG. 1F, the structure is planarized by applying chemical-mechanical polishing in the presence of an abrasive slurry that is highly selective of silicon dioxide with respect to polysilicon. The polishing grinds down oxide layer 120, and is discontinued using polysilicon region 112 as a stop-layer. After polishing occurs, the top surfaces of polysilicon region 112 and oxide layer 120 are exposed and aligned with one another and form a planar surface.

Figure 1G:
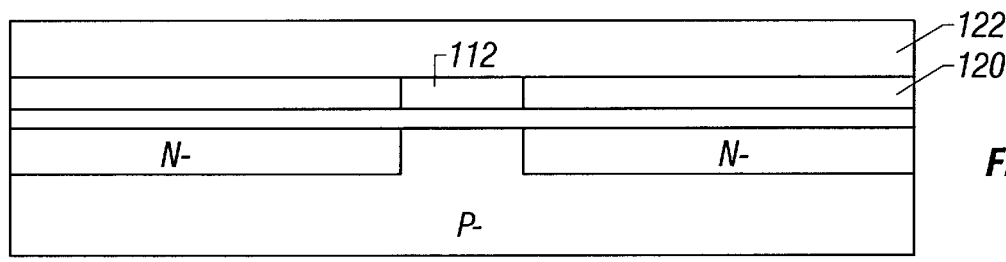

In FIG. 1G, polysilicon layer 122 is deposited by low pressure chemical vapor deposition on the top surfaces of polysilicon region 112 and oxide layer 120. Polysilicon layer 122 is undoped and has a thickness of 2000 angstroms. If desired, polysilicon layer 122 can be doped in situ as deposition occurs, or doped immediately after deposition by implanting arsenic with a dosage in the range of $1 \times 10^5$ to $5 \times 10^{15}$ atoms/cm$^2$ and an energy in the range of 10 to 50 kiloelectron-volts. However, it is generally preferred that polysilicon layer 122 be doped during later processing steps.

Figure 1H:
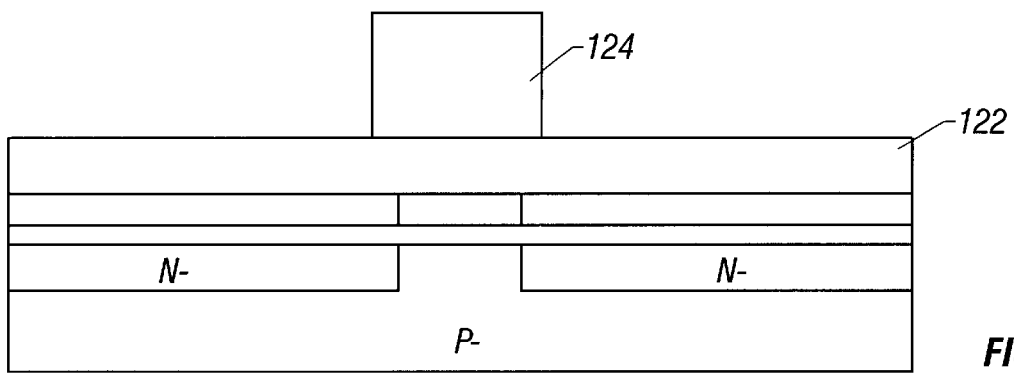

In FIG. 1H, photoresist layer 124 is deposited on polysilicon layer 122. Since polysilicon layer 122 has a thickness of 2000 angstroms, photoresist layer 124 has a thickness of 8000 angstroms. The photolithographic system uses the first reticle to irradiate photoresist layer 124 with the first image pattern. Thereafter, the irradiated portions of photoresist layer 124 are removed, and photoresist layer 124 includes openings above selected portions of the active region. Of importance, photoresist layer 124 is relatively thick and fails to replicate the first image pattern with as a high degree of accuracy as did photoresist layer 110.

Figure 1I:
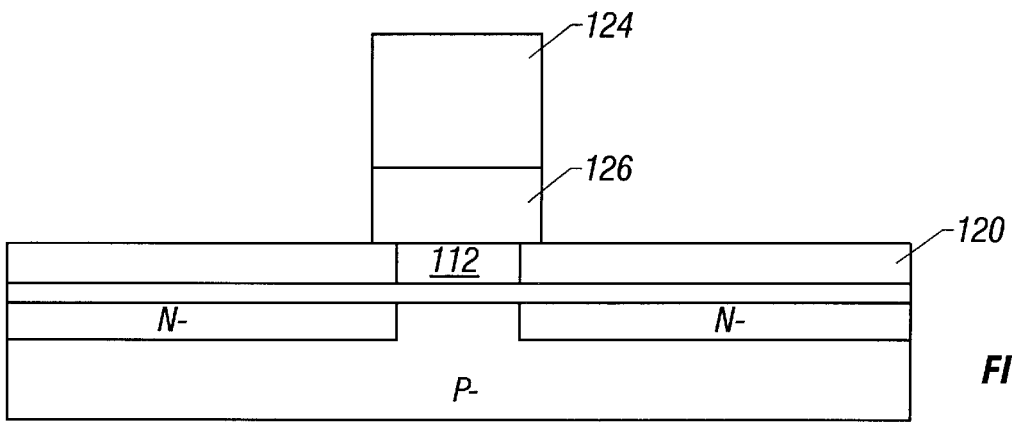

In FIG. 1I, an anisotropic dry etch is applied using photoresist layer 124 as an etch mask. Photoresist layer 124 protects the underlying regions of polysilicon layer 122, and the etch removes the regions of polysilicon layer 122 beneath the openings in photoresist layer 124. The etch is highly selective of polysilicon layer 122 with respect to oxide layer 120, so only a negligible amount of oxide layer 120 is removed. The etch forms polysilicon region 126 from the unetched portion of polysilicon layer 122 over the active region. Polysilicon region 126 includes opposing vertical edges separated by a length of 3700 angstroms, has a height (or thickness) of 2000 angstroms, and is disposed on polysilicon region 112. It is noted that the etch applied to polysilicon layer 122 need not be as selective of polysilicon with respect to silicon dioxide as the etch applied to polysilicon layer 106.

Thus, the multilevel gate consists of polysilicon region 112 as the lower gate level and polysilicon region 126 as the upper gate level. The lengths (or critical dimensions) of polysilicon region 112 and polysilicon region 126 differ due to variations in the abilities of photoresist layers 110 and 124 to accurately replicate the first image pattern. However, the channel length defined by lightly doped source/drain regions 116 and 118 is not affected by the relatively inaccurate image pattern replication of photoresist layer 124.

Figure 1J:
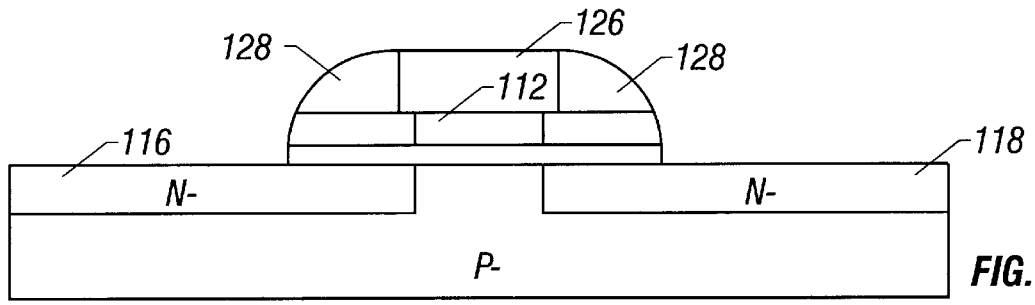

In FIG. 1J, photoresist 124 is stripped, and an oxide layer with a thickness of 1500 angstroms is conformally deposited over the exposed surfaces by plasma enhanced chemical vapor deposition at a temperature in the range of 300 to 450° C. Thereafter, the structure is subjected to an anisotropic reactive ion etch that forms oxide spacers 128 adjacent to the opposing vertical edges of polysilicon region 112 and polysilicon region 126. Spacers 128 cover portions of lightly doped source/drain regions 116 and 118.

Figure 1K:
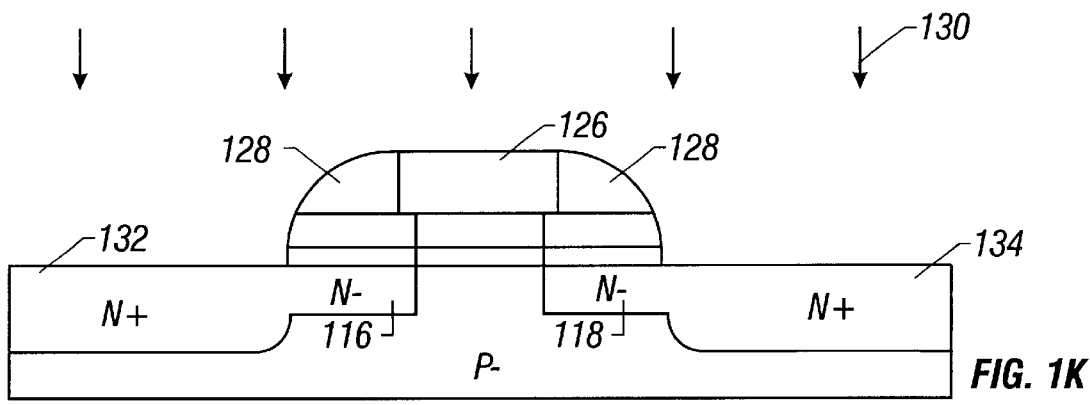

In FIG. 1K, heavily doped source and drain regions are implanted into the active region by subjecting the structure to ion implantation of arsenic, indicated by arrows 130, at a dose in the range of $1 \times 10^{15}$ to $5 \times 10^{15}$ atoms/cm$^2$ and an energy in the range of 10 to 80 kiloelectron-volts, using upper gate level 126 and spacers 128 as an implant mask. As a result, heavily doped source/drain regions 132 and 134 are implanted in the active region and are substantially aligned to the outside edges of spacers 128. Heavily doped source/drain regions 132 and 134 are doped N+ with an arsenic concentration in the range of about $1 \times 10^{18}$ to $1 \times 10^{20}$ atoms/cm$^3$ and a depth in the range of 300 to 2500 angstroms.

Preferably, the depth of heavily doped source/drain regions 132 and 134 exceeds that of lightly doped source/drain regions 116 and 118.

Figure 1L:
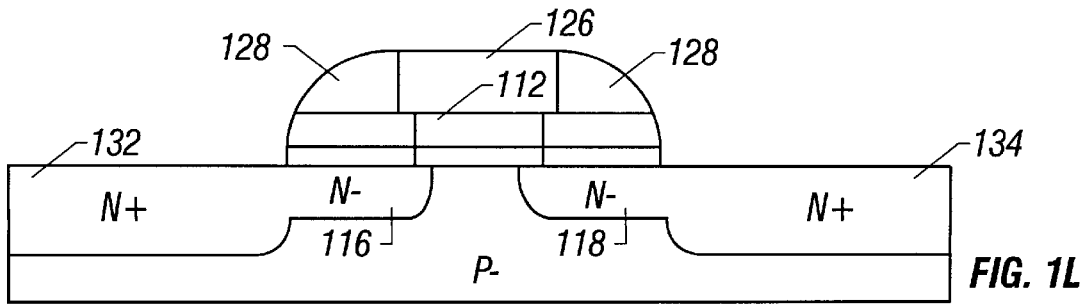

In FIG. 1L, the device is annealed to remove crystalline damage and to drive-in and activate the implanted dopants by applying a rapid thermal anneal on the order of 950 to 1050° C. for 10 to 30 seconds. Regions 116 and 132 form a source and regions 118 and 134 form a drain for an NMOS device in the active region. Since the dopants diffuse both vertically and laterally, heavily doped regions 132 and 134 extend partially beneath spacers 128, and lightly doped regions 116 and 118 extend slightly beneath polysilicon region 112. Polysilicon region 126 is more heavily doped than polysilicon region 112, and therefore has higher electrical conductivity than polysilicon region 112.

FIGS. 2A–2J show cross-sectional views of successive process steps for forming an IGFET with a multilevel gate in accordance with a second embodiment of the invention. The primary difference between the second embodiment and the first embodiment is that in the second embodiment, the upper gate level is formed by selectively depositing epitaxial silicon on the lower gate level. Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
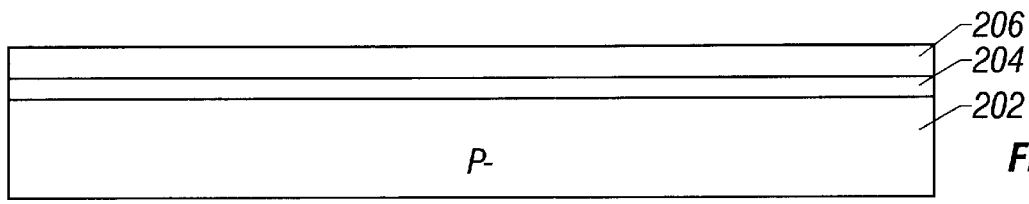
FIGS. 2A–2J show cross-sectional views of successive process steps for making an IGFET with a multilevel gate in accordance with a second embodiment of the invention.

In FIG. 2A, semiconductor substrate 202 suitable for integrated circuit manufacture is provided, gate oxide 204 is thermally grown on an active region of substrate 202, and polysilicon layer 206 with a thickness of 500 angstroms is deposited on gate oxide 204.

Figure 2B:
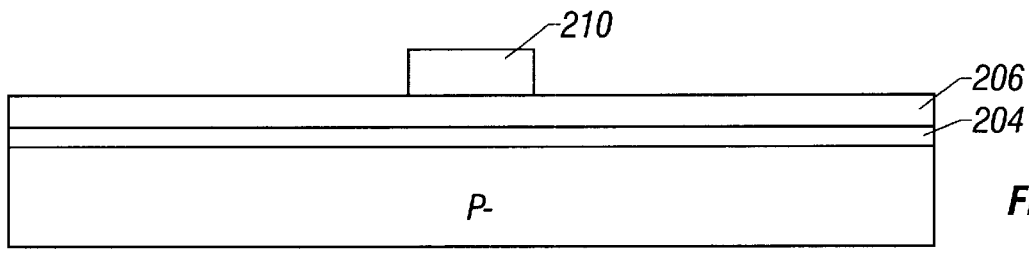

In FIG. 2B, photoresist layer 210 with a thickness of 2000 angstroms is deposited as a continuous layer on polysilicon layer 206 and then selectively irradiated using a step and repeat system. Thereafter, photoresist layer 210 is developed and the irradiated portions are removed to provide openings above the active region.

Figure 2C:
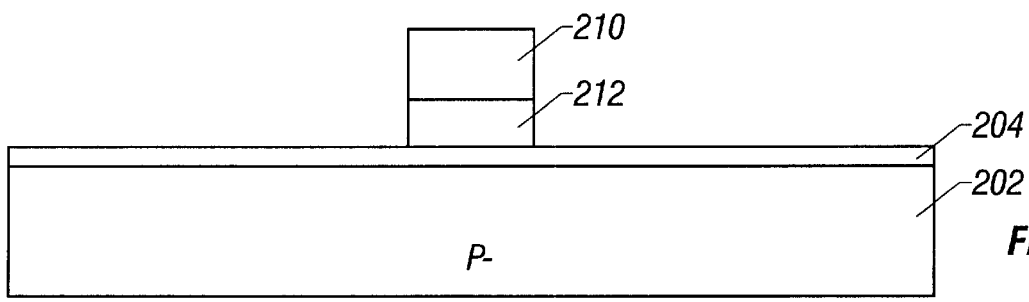

In FIG. 2C, an anisotropic etch is applied using photoresist layer 210 as an etch mask. The etch forms polysilicon region 212 from the unetched portion of polysilicon layer 206 over the active region.

Figure 2D:
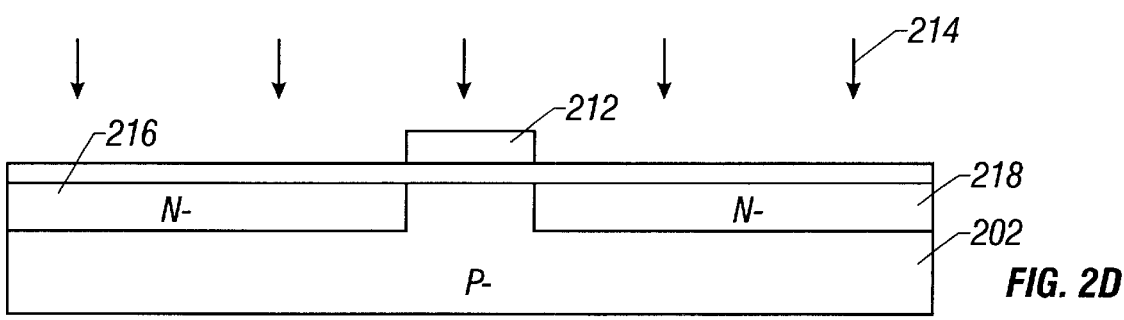

In FIG. 2D, photoresist layer 210 is stripped, and lightly doped source and drain regions are implanted into the active region by subjecting the structure to ion implantation of arsenic, indicated by arrows 214, using polysilicon region 212 as an implant mask. As a result, lightly doped source/drain regions 216 and 218 are implanted into the active region and doped N− and self-aligned to the opposing vertical edges of polysilicon region 212.

Figure 2E:
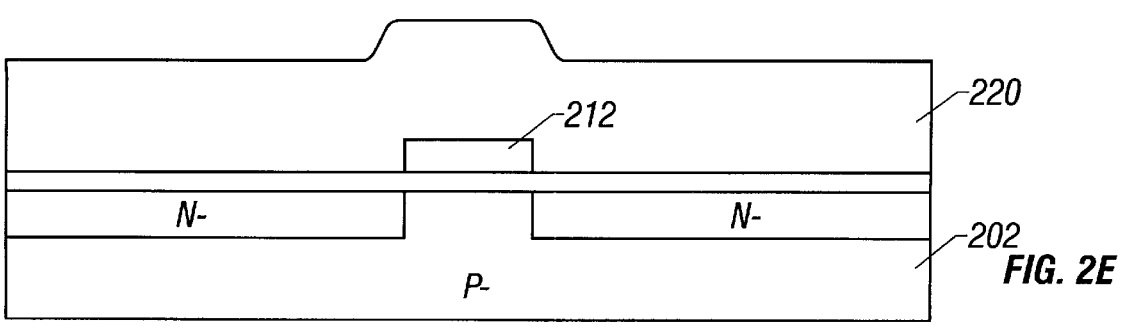

In FIG. 2E, oxide layer 220 is deposited over substrate 202 and covers polysilicon region 212.

Figure 2F:
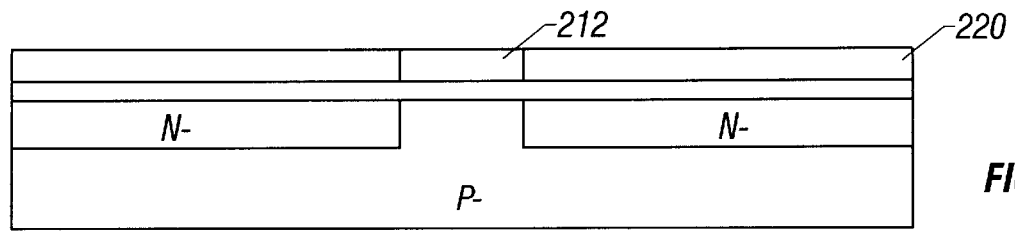

In FIG. 2F, the structure is planarized by applying chemical-mechanical polishing so that the top surfaces of polysilicon region 212 and oxide layer 220 are exposed and aligned with one another and form a planar surface.

Figure 2G:
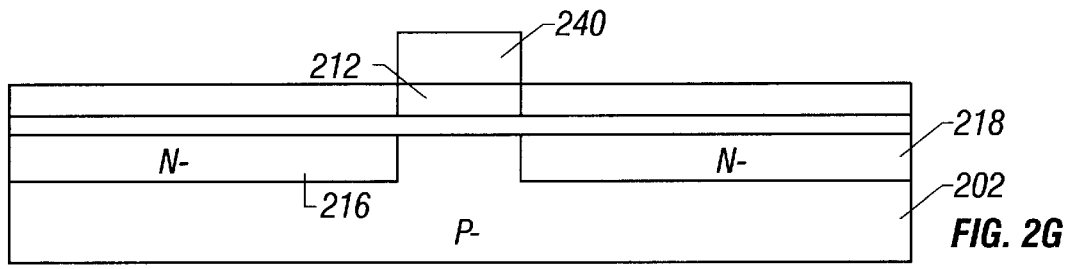

In FIG. 2G, epitaxial silicon 240 is selectively deposited on polysilicon region 212 without being deposited on substrate 202. There are basically two types of selective epitaxial deposition processes. In "Type 1" processes, epitaxial growth occurs only on the exposed silicon and no growth occurs on the exposed oxide. In "Type 2" processes, epitaxial growth occurs on both the exposed silicon and the exposed oxide. Epitaxial silicon 240 is deposited using a Type 1 process to avoid deposition on oxide layer 220, thereby saving a mask step. $SiCl_4$ and $SiHCl_3$ provide suitable silicon sources. $SiH_2Cl_2$ and $SiH_4$ also provide suitable silicon sources if HCl or $Cl_2$ is added to the reaction. Furthermore, bromine based silicon compounds such as $SiHBr_3$ and $SiBr_4$ have shown improved selectivity over their chlorinated counterparts. Factors that enhance the selective nature of a Type 1 process include reduced pressure, increased temperature, and decreased mole fraction of the silicon source in the gas stream. Selective deposition of epitaxial silicon is well-known in the art. See, for instance, SILICON PROCESSING FOR THE VLSI ERA, Volume 1: Process Technology, by S. Wolf and R. N. Tauber, published by Lattice Press, Sunset Beach, Calif., pp. 155–156 (1986), which is incorporated by reference.

Thus, the multilevel gate includes polysilicon region 212 as the lower gate level and epitaxial silicon 240 as the upper gate level. In addition, the channel length defined by lightly doped source/drain regions 216 and 218 is not affected by the amount (if any) that epitaxial silicon 240 extends outside the opposing vertical edges of polysilicon region 212.

Figure 2H:
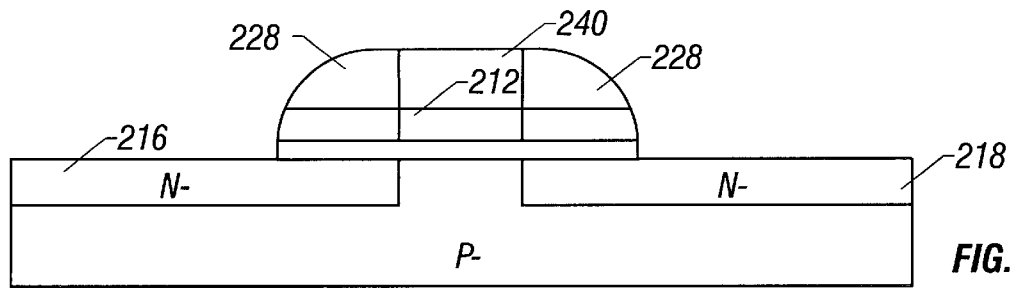

In FIG. 2H, an oxide layer is conformally deposited over the exposed surfaces, the structure is subjected to an anisotropic reactive ion etch that forms oxide spacers 228 adjacent to the opposing vertical edges of polysilicon region 212 and epitaxial silicon 240. Spacers 228 cover portions of lightly doped source/drain regions 216 and 218.

Figure 2I:
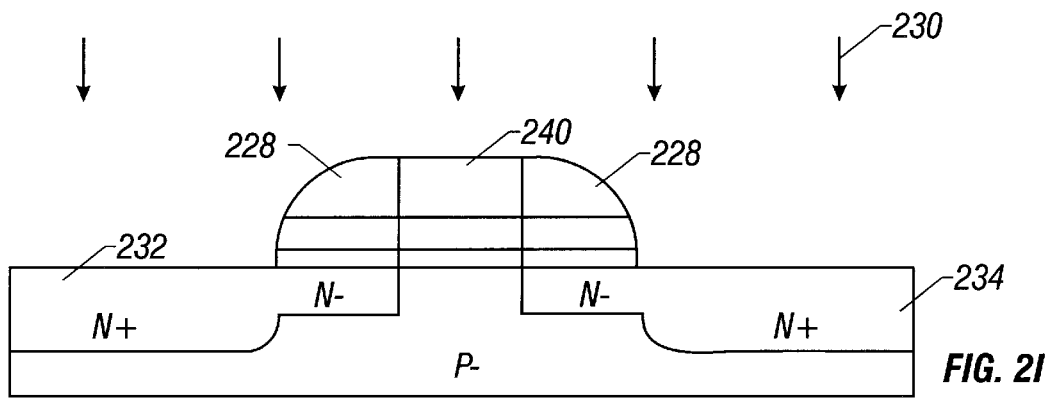

In FIG. 2I heavily doped source and drain regions are implanted into the active region by subjecting the structure to ion implantation of arsenic, indicated by arrows 230, using epitaxial silicon 240 and spacers 228 as an implant mask. As a result, heavily doped source/drain regions 232 and 234 are implanted in the active region and doped N+ and self-aligned to the outside edges of spacers 228.

Figure 2J:
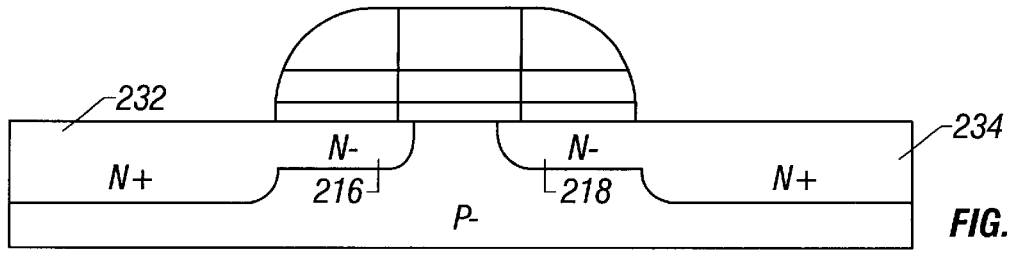

In FIG. 2J, the device is annealed to remove crystalline damage and to drive-in and activate the implanted dopants by applying a rapid thermal anneal. Regions 216 and 232 form a source and regions 218 and 234 form a drain for an NMOS device in the active region.

FIGS. 3A–3J show cross-sectional views of successive process steps for forming an IGFET with a multilevel gate in accordance with a third embodiment of the invention. The primary difference between the third embodiment and the first embodiment is that in the third embodiment, the upper gate level is formed by a metal silicide. Unless otherwise noted, the elements for the third embodiment (e.g., substrate 302, gate oxide 304, etc.) are similar to elements of the first embodiment (e.g., substrate 102, gate oxide 104, etc.), and the description of related elements and process steps need not be repeated.

Figure 3A:
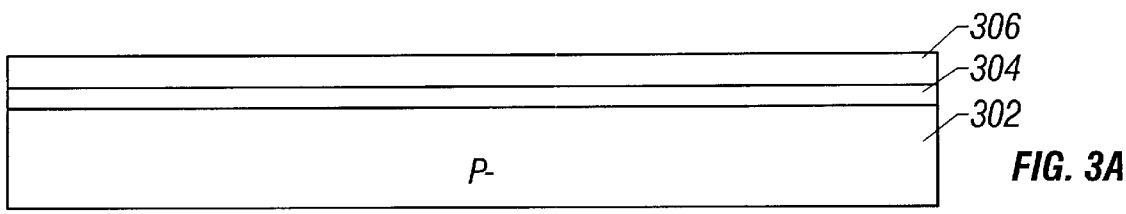
FIGS. 3A–3J show cross-sectional views of successive process steps for making an IGFET with a multilevel gate in accordance with a third embodiment of the invention.

In FIG. 3A, semiconductor substrate 302 suitable for integrated circuit manufacture is provided, gate oxide 304 is thermally grown on an active region of substrate 302, and polysilicon layer 306 with a thickness of 500 angstroms is deposited on gate oxide 304.

Figure 3B:
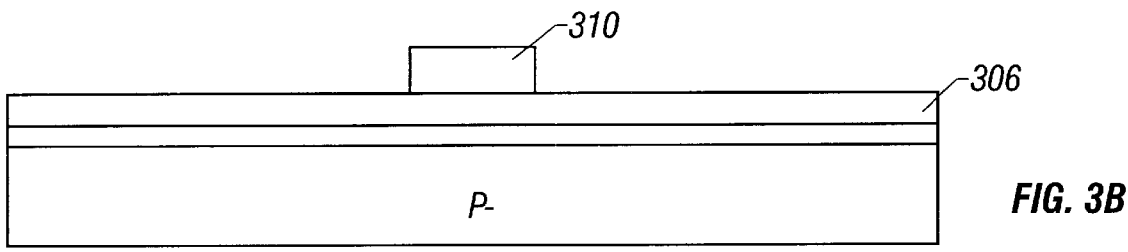

In FIG. 3B, photoresist layer 310 with a thickness of 2000 angstroms is deposited as a continuous layer on polysilicon layer 306 and then selectively irradiated using a step and repeat system. Thereafter, photoresist layer 310 is developed and the irradiated portions are removed to provide openings above the active region.

Figure 3C:
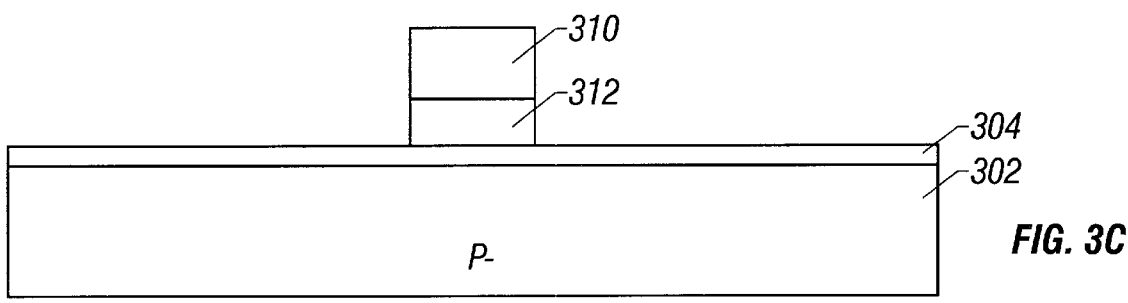

In FIG. 3C, an anisotropic etch is applied using photoresist layer 310 as an etch mask. The etch forms polysilicon region 312 from the unetched portion of polysilicon layer 306 over the active region.

Figure 3D:
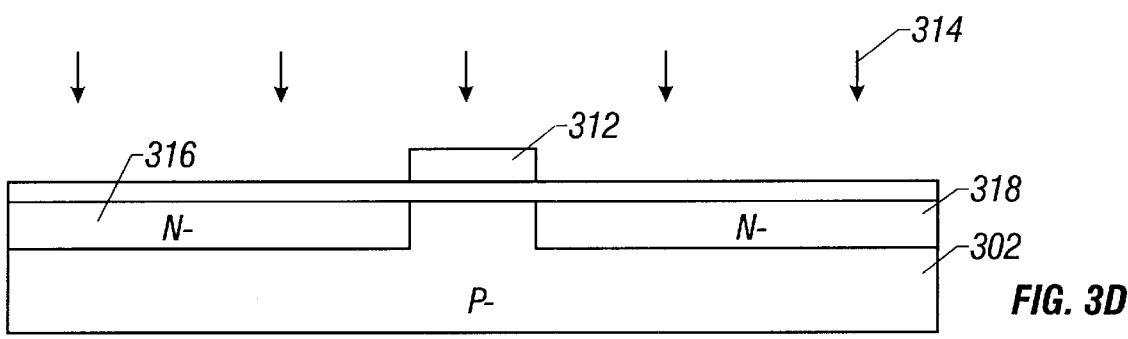

In FIG. 3D, photoresist layer 310 is stripped, and lightly doped source and drain regions are implanted into the active region by subjecting the structure to ion implantation of arsenic, indicated by arrows 314, using polysilicon region 312 as an implant mask. As a result, lightly doped source/drain regions 316 and 318 are implanted into the active region and doped N− and self-aligned to the opposing vertical edges of polysilicon region 312.

Figure 3E:
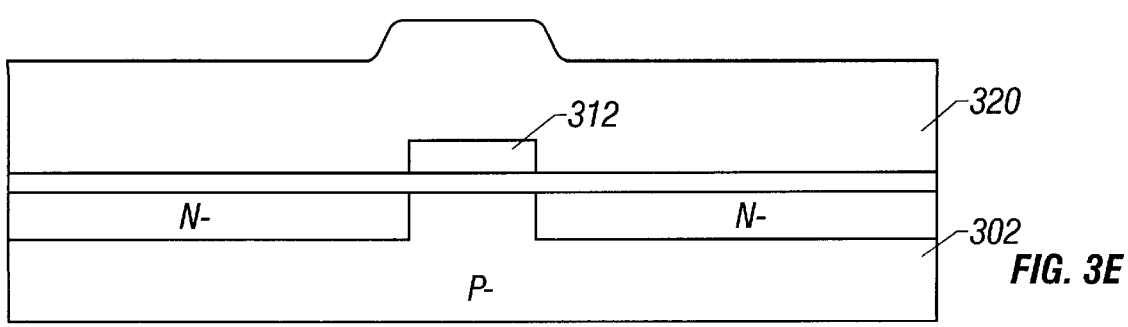

In FIG. 3E, oxide layer 320 is deposited over substrate 302 and covers polysilicon region 312.

Figure 3F:
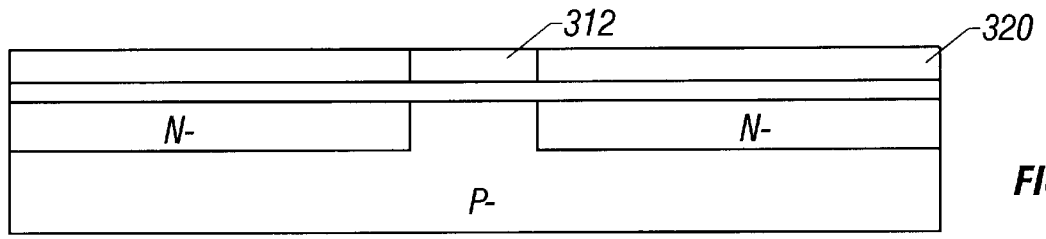

In FIG. 3F, the structure is planarized by applying chemical-mechanical polishing so that the top surfaces of polysilicon region 312 and oxide layer 320 are exposed and aligned with one another and form a planar surface.

Figure 3G:
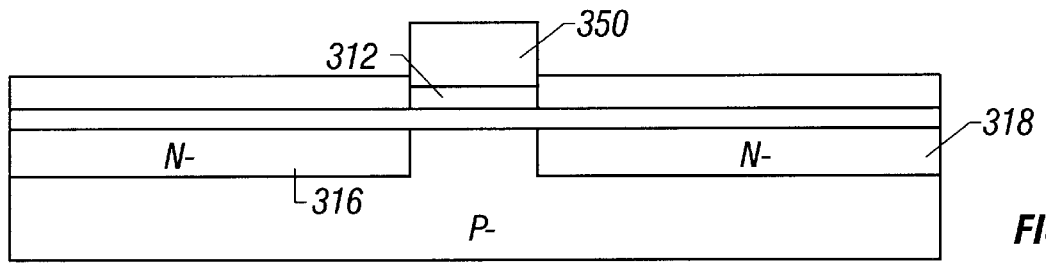

In FIG. 3G, a blanket layer of titanium that is 300 angstroms thick is deposited over the structure, a rapid thermal anneal on the order of 700° C. for 30 seconds in a nitrogen ambient is applied to form titanium silicide 350 on polysilicon region 312 and form titanium nitride on oxide layer 320, and a wet chemical etch is applied to remove the titanium nitride. It should be noted that none of the titanium is deposited on substrate 302, and no titanium silicide is formed on substrate 302. Furthermore, the formation of titanium silicide 350 reduces the thickness of polysilicon region 312.

Thus, the multilevel gate includes polysilicon region 312 as the lower gate level and titanium silicide 350 as the upper gate level. In addition, the channel length defined by lightly doped source/drain regions 316 and 318 is not affected by the amount (if any) that titanium silicide 350 extends outside the opposing vertical edges of polysilicon region 312.

Figure 3H:
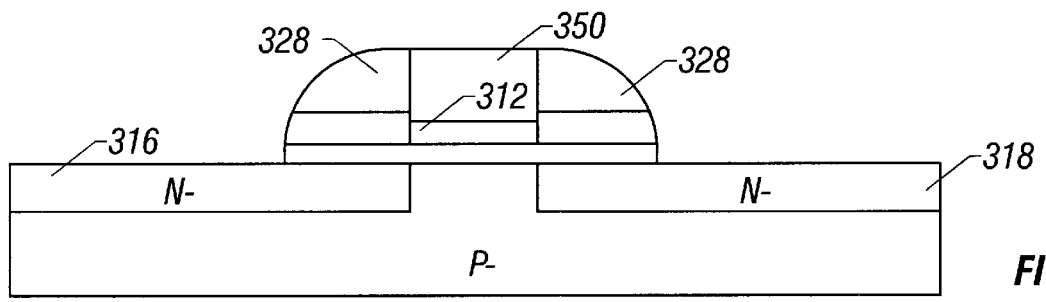

In FIG. 3H, an oxide layer is conformally deposited over the exposed surfaces, and the structure is subjected to an anisotropic reactive ion etch that forms oxide spacers 328 adjacent to the opposing vertical edges of polysilicon region 312 and titanium silicide 350. Spacers 328 cover portions of lightly doped source/drain regions 316 and 318.

Figure 3I:
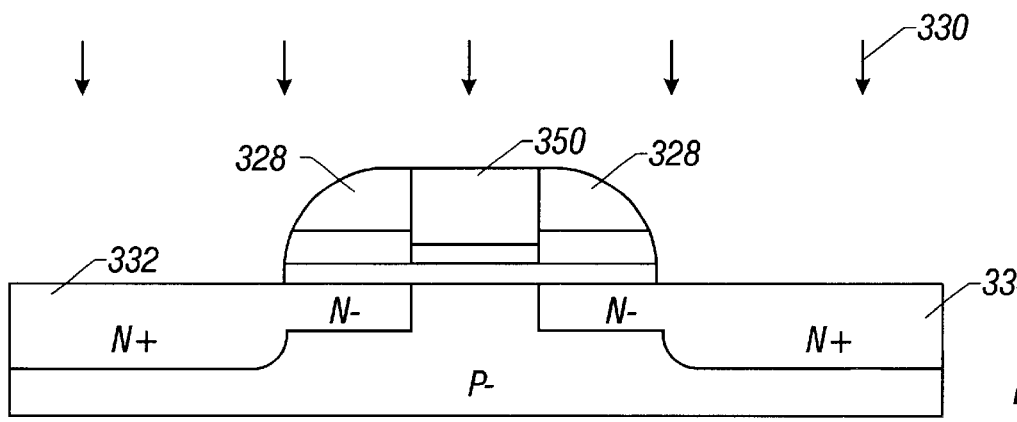

In FIG. 3I, heavily doped source and drain regions are implanted into the active region by subjecting the structure to ion implantation of arsenic, indicated by arrows 330, using titanium silicide 350 and spacers 328 as an implant mask. As a result, heavily doped source/drain regions 332 and 334 are implanted in the active region and doped N+ and self-aligned to the outside edges of spacers 328.

Figure 3J:
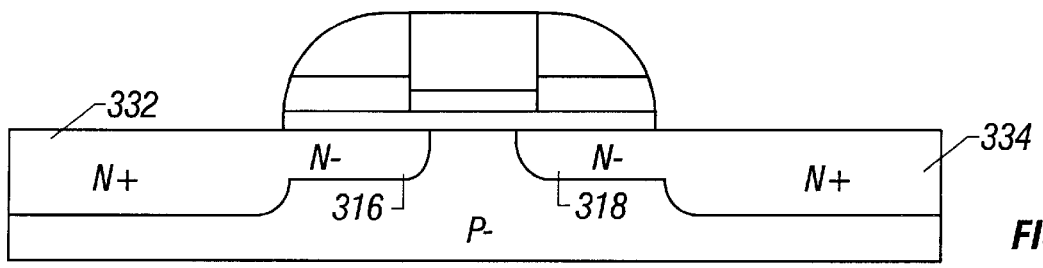

In FIG. 3J, the device is annealed to remove crystalline damage and to drive-in and activate the implanted dopants by applying a rapid thermal anneal. Regions 316 and 332 form a source and regions 318 and 334 form a drain for an NMOS device in the active region.

FIGS. 4A–4J show cross-sectional views of successive process steps for forming an IGFET with a multilevel gate in accordance with a fourth embodiment of the invention. The primary difference between the fourth embodiment and the first embodiment is that in the fourth embodiment, the upper gate level is formed by depositing an insulating layer over the substrate and on the lower gate level, forming a trench partially through the insulating layer that exposes the lower gate level, and depositing a second gate material into the trench. Another key difference is that the upper gate level is designed to include opposing sidewalls that extend laterally beyond the opposing sidewalls of the lower gate level, and the upper gate level alone provides an implant mask that protects portions of the lightly doped source and drain regions during implantation of the heavily doped source and drain regions. Accordingly, the sidewall spacers can be omitted. Unless otherwise noted, the elements for the fourth embodiment (e.g., substrate 402, gate oxide 404, etc.) are similar to elements of the first embodiment (e.g., substrate 102, gate oxide 104, etc.), and the description of related elements and process steps need not be repeated.

Figure 4A:
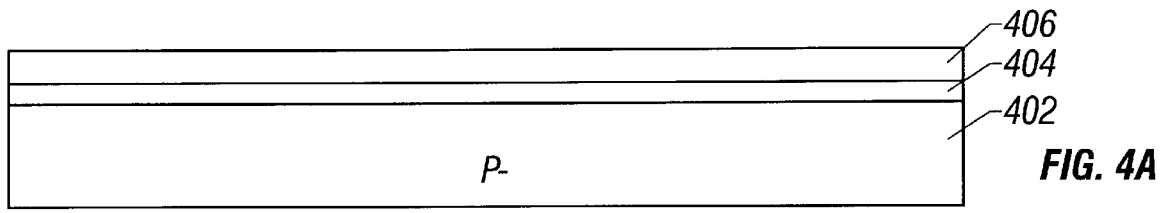
FIGS. 4A–4J show cross-sectional views of successive process steps for making an IGFET with a multilevel gate in accordance with a fourth embodiment of the invention.

In FIG. 4A, semiconductor substrate 402 suitable for integrated circuit manufacture is provided, gate oxide 404 is thermally grown on an active region of substrate 402, and polysilicon 406 with a thickness of 500 angstroms is deposited on gate oxide 404.

Figure 4B:
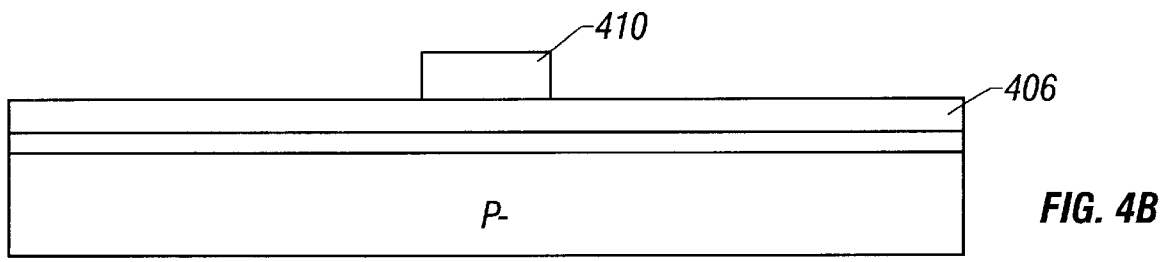

In FIG. 4B, photoresist layer 410 with a thickness of 2000 angstroms is deposited as a continuous layer on polysilicon layer 406 and then selectively irradiated using a step and repeat system. Thereafter, photoresist layer 410 is developed and the irradiated portions are removed to provide openings above the active region.

Figure 4C:
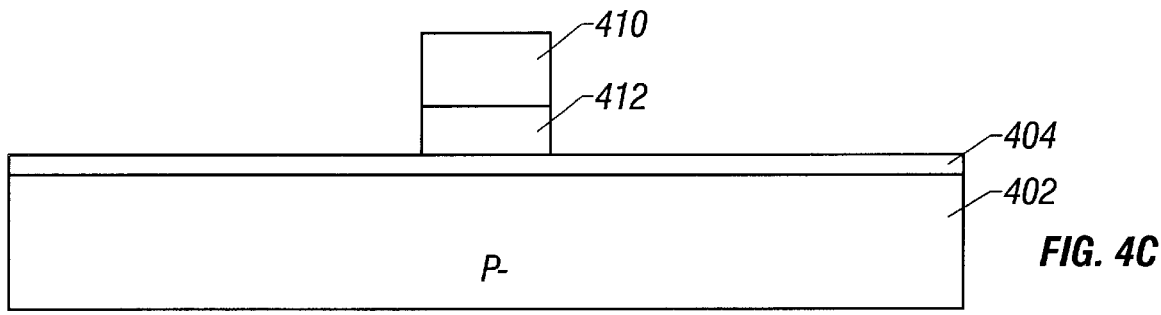

In FIG. 4C, an anisotropic etch is applied using photoresist layer 410 as an etch mask. The etch forms polysilicon region 412 from the unetched portion of polysilicon layer 406 over the active region.

Figure 4D:
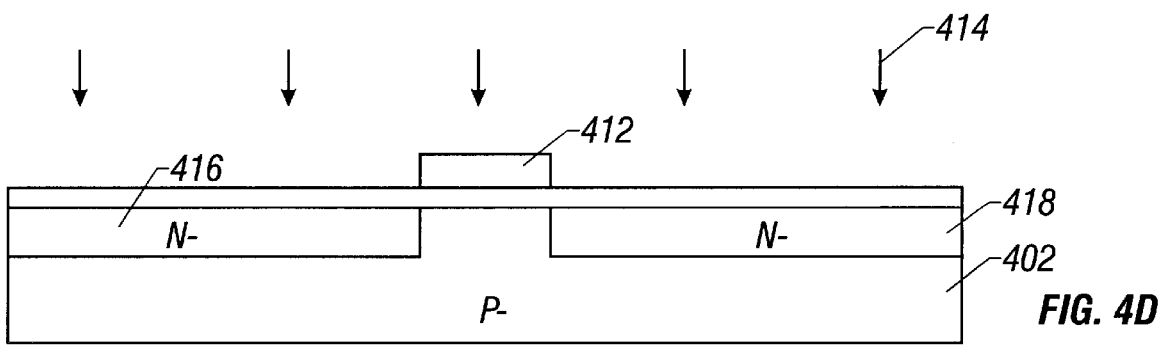

In FIG. 4D, photoresist layer 410 is stripped, and lightly doped source and drain regions are implanted into the active region by subjecting the structure to ion implantation of arsenic, indicated by arrows 414, using polysilicon region 412 as an implant mask. As a result, lightly doped source/drain regions 416 and 418 are implanted into the active region and doped N– and self-aligned to the opposing vertical edges of polysilicon region 412.

Figure 4E:
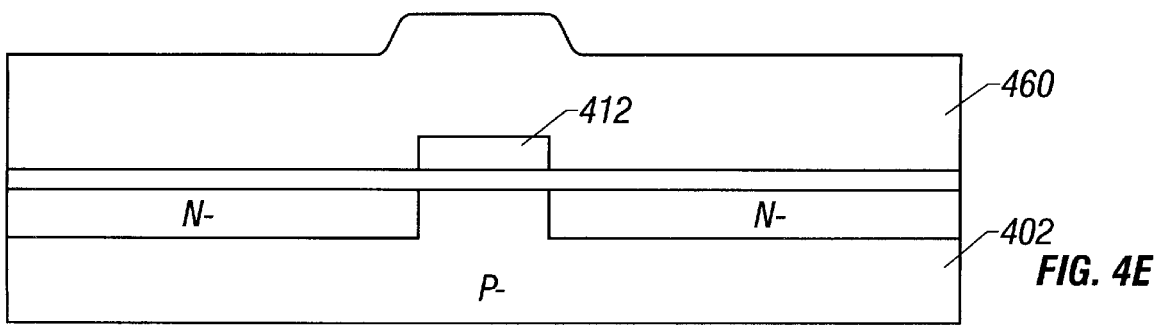

In FIG. 4E, oxide layer 460 is deposited by plasma enhanced chemical vapor deposition over substrate 402 and covers polysilicon region 412. Oxide layer 460 has a thickness of about 3000 angstroms.

Figure 4F:
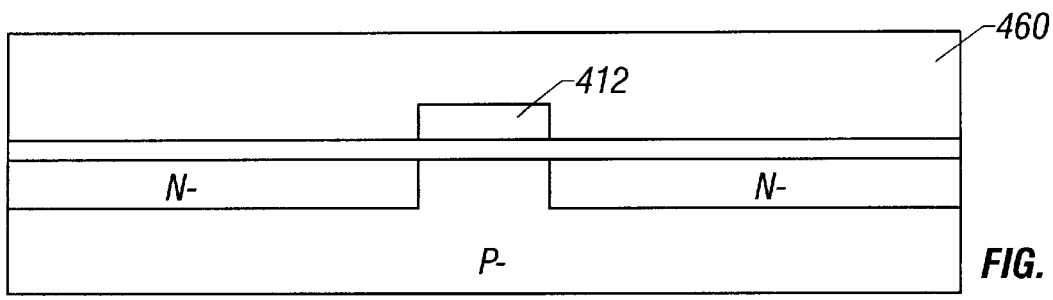

In FIG. 4F, the structure is planarized by applying chemical-mechanical polishing so that the top surface of oxide layer 460 forms a planar top surface about 2000 angstroms above the top surface of polysilicon region 412.

Figure 4G:
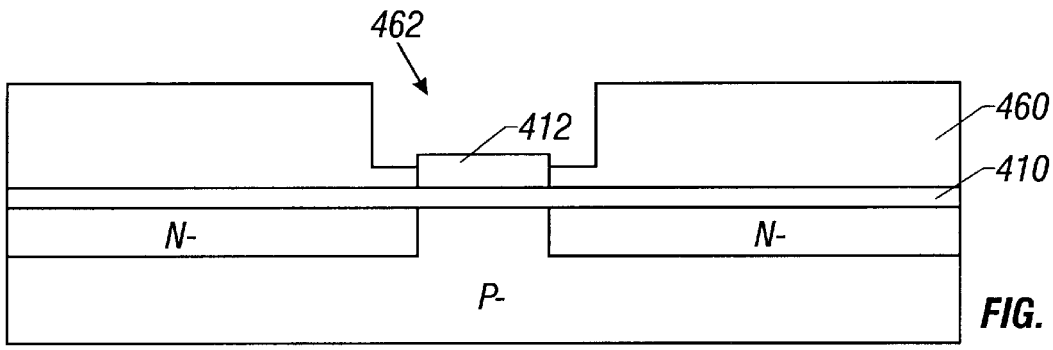

In FIG. 4G, a photoresist layer (not shown) is deposited as a continuous layer on oxide layer 460 and then selectively irradiated using the step and repeat system. Thereafter, the photoresist layer is developed and the irradiated portions are removed to provide an opening therethrough, and an anisotropic etch is applied that is highly selective of silicon dioxide with respect to polysilicon. The etch forms trench 462 partially through oxide layer 460. Trench 462 exposes the entire top surface of polysilicon region 412 and includes opposing vertical edges separated by a length of 4000 angstroms, with each vertical edge laterally positioned about 250 angstroms beyond the opposing vertical edges of polysilicon region 412. In addition, trench 462 extends slightly beneath the top surface of polysilicon region 412, thereby exposing upper portions of the opposing vertical edges of polysilicon region 412. Alternatively, trench 462 may extend far beneath the top surface of polysilicon region 412, as long as trench 462 extends only partially through oxide layer 460 and does not reach gate oxide 410.

Figure 4H:
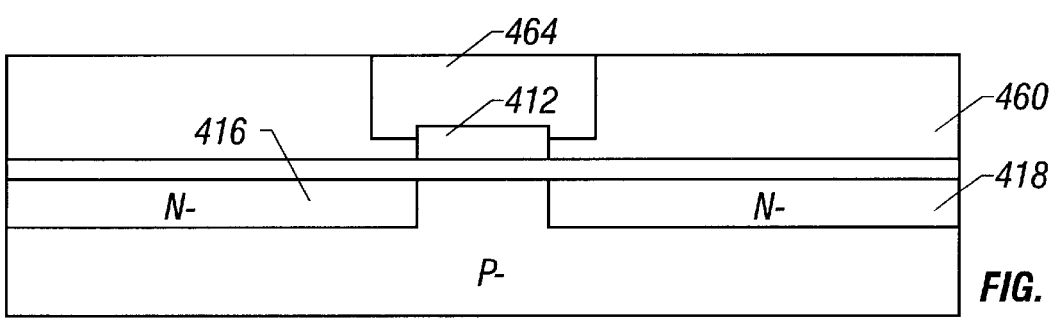

In FIG. 4H, a blanket layer of undoped polysilicon is deposited by low pressure chemical vapor deposition over the structure. The polysilicon layer completely fills trench 462 and contacts both the entire upper surface and the upper portions of the opposing vertical edges of polysilicon region 412. Thereafter, the structure is planarized by applying chemical-mechanical polishing in the presence of an abrasive shiny that is highly selective of polysilicon with respect to silicon dioxide. The polishing grinds down the polysilicon layer, and is discontinued using oxide layer 460 as a stop-layer. After polishing occurs, polysilicon region 464 remains in trench 462. Furthermore, the top surfaces of polysilicon region 464 and oxide layer 460 are exposed and aligned with one another and form a planar top surface.

Thus, the multilevel gate includes polysilicon region 412 as the lower gate level and polysilicon region 464 as the upper gate level. The opposing vertical edges of polysilicon region 464 extend laterally about 250 angstroms beyond the opposing vertical edges of polysilicon region 412. In addition, the channel length defined by lightly doped source/drain regions 416 and 418 is not affected by the amount that polysilicon region 464 extends outside the opposing vertical edges of polysilicon region 412.

Figure 4I:
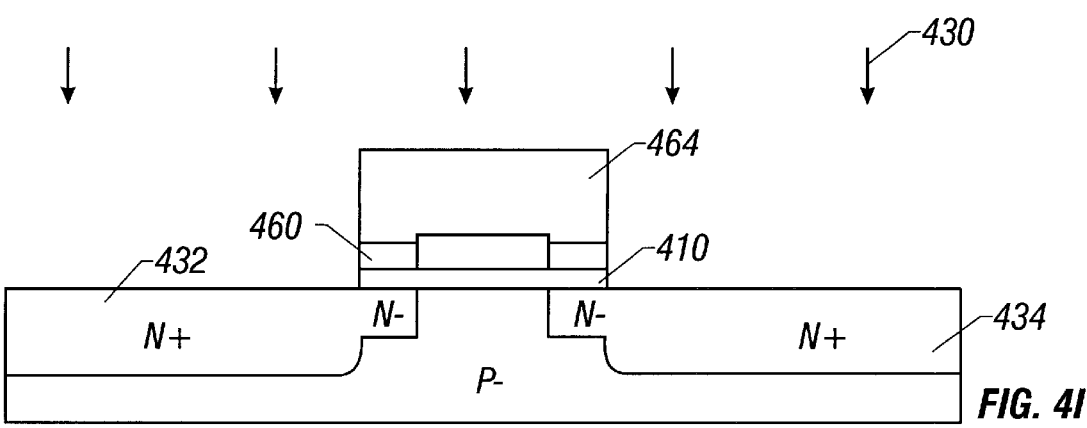

In FIG. 4I, an anisotropic etch is applied that is highly selective of silicon dioxide with respect to polysilicon. The etch removes portions of oxide layer 460 and gate oxide 410 that are outside the opposing vertical edges of polysilicon region 464. Thereafter, heavily doped source and drain regions are implanted into the active region by subjecting the structure to ion implantation of arsenic, indicated by arrows 430, using polysilicon region 464 as an implant mask. As a result, heavily doped source/drain regions 432 and 434 are implanted in the active region and doped N+ and self-aligned to the opposing vertical edges of polysilicon region 464.

Figure 4J:
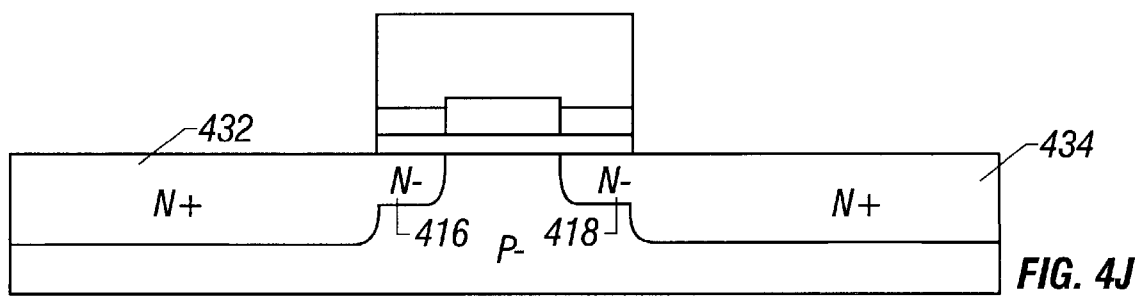

In FIG. 4J, the device is annealed to remove crystalline damage and to drive-in and activate the implanted dopants by applying a rapid thermal anneal. Regions 416 and 432 form a source and regions 418 and 434 form a drain for an NMOS device in the active region.

Further processing steps in the fabrication of IGFETs typically include forming salicide contacts on the gates, sources and drains, forming a thick oxide layer over the active regions, forming contact windows in the oxide layer to expose the salicide contacts, forming interconnect metalization in the contact windows, and forming a passivation layer over the metallization. In addition, earlier or subsequent high-temperature process steps can be used to supplement or replace the anneal step to provide the desired anneal, activation, and drive-in functions. These further processing steps are conventional and need not be repeated herein. Likewise the principal processing steps disclosed herein may be combined with other steps apparent to those skilled in the art.

Advantageously, in the embodiments described above, the lower gate level has a tightly controlled length that defines the channel length. The upper gate level can have far greater thickness, far higher electrical conductivity and/or far different length than the lower gate level without affecting the channel length.

Furthermore, in the first and fourth embodiments, the upper gate level can provide a local interconnect between otherwise disconnected lower gate levels over separate active regions, for instance to electrically couple the gates of a CMOS inverter pair.

The present invention includes numerous variations to the embodiments described above. For instance, the first photoresist layer can be left on the lower gate level and used as an implant mask when the lightly doped source/drain regions are implanted. See, for instance, U.S. application Ser. No. [unassigned, attorney docket no. M-3990 US] filed concurrently herewith, entitled "Method of Making NMOS and PMOS Devices with Reduced Masking Steps" by Hause et al., which is incorporated by reference. Alternatively, implanting the lightly doped source and drain regions can include implanting ions through the lower gate level into the active region so that the IGFET is a depletion-mode device. As another alternative, the lightly doped source and drain regions can be implanted using the upper gate level as an implant mask, particularly if ultra-thin first and second photoresist layers are patterned with the same image pattern to provide etch masks for the lower and upper gate levels, respectively. Moreover, a lower polysilicon gate level can be selectively doped by diffusing a dopant from an upper polysilicon gate level. See, for instance, U.S. application Ser. No. [unassigned, attorney docket no. M3991 US] filed concurrently herewith, entitled "Method of Making an IGFET with a Selectively Doped Multilevel Polysilicon Gate" by Hause et al., which is incorporated by reference.

The lower gate level can be various conductors, and the upper gate level can be various conductors such as epitaxial silicon, polysilicon, conductive metals, and conductive metal silicides. The lower and upper gate levels may each include several layers of conductive materials. The gate insulator, spacers, and insulating layer can be various dielectrics such as silicon dioxide, silicon nitride and silicon oxynitride. The insulating layer can also be spin-on glass.

The active region can be isolated using various techniques such as LOCOS oxidation. Various refractory metals can be used to form a conductive metal silicide as the upper gate level. The photoresist layers can pattern other masking layers to be used as an etch mask and/or implant mask. Furthermore, all source/drain doping can be provided by a single implant step. The conductivities of the active region and implanted dopants can be reversed. Suitable N-type dopants include arsenic and phosphorus; suitable P-type dopants include boron $B_{10}$, boron $B_{11}$, and $BF_x$ species such as $BF_2$.

The invention is particularly well-suited for fabricating N-channel MOSFETs, P-channel MOSFETs and other types of IGFETs, particularly for high-performance microprocessors where high circuit density is essential. Although a single N-channel device has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an IGFET with a multilevel gate, comprising the steps of:

providing a semiconductor substrate with an active region;

forming a gate insulator on the active region;

forming a first gate material with a thickness of at most 1000 angstroms on the gate insulator and over the active region;

forming a first photoresist layer over the first gate material;

irradiating the first photoresist layer with a first image pattern and removing irradiated portions of the first photoresist layer to provide openings above the active region;

etching the first gate material through the openings in the first photoresist layer using the first photoresist layer as an etch mask for a portion of the first gate material that forms a lower gate level;

removing the first photoresist layer;

forming an upper gate level on the lower gate level after removing the first photoresist layer, wherein the multilevel gate includes the upper and lower gate levels; and forming a source and drain in the active region.

2. The method of claim 1, including:

depositing an insulating layer over the substrate and on the lower gate level after removing the first photoresist layer;

polishing the insulating layer until a top surface of the lower gate level is exposed; and then forming the upper gate level.

3. The method of claim 1, wherein forming the upper gate level includes:

depositing a second gate material over the substrate and on the lower gate level;

forming a second photoresist layer over the second gate material;

irradiating the second photoresist layer with a second image pattern and removing irradiated portions of the second photoresist layer to provide openings above the active region;

etching the second gate material through the openings in the second photoresist layer using the second photoresist layer as an etch mask for a portion of the second gate material that forms the upper gate level; and removing the second photoresist layer.

4. The method of claim 3, wherein the second photoresist layer has a substantially greater thickness than that of the first photoresist layer, and the first and second image patterns are essentially identical.

5. The method of claim 1, wherein forming the upper gate level includes selectively depositing epitaxial silicon on the lower gate level without depositing epitaxial silicon on the substrate.

6. The method of claim 1, wherein forming the upper gate level includes:

depositing a refractory metal over the substrate and on the lower gate level without depositing refractory metal on the substrate;

applying an anneal to form a metal silicide on the lower gate level without forming metal silicide on the substrate.

7. The method of claim 1, wherein forming the upper gate level includes:

depositing an insulating layer over the substrate and the lower gate level;

forming a trench partially through the insulating layer that exposes the lower gate level; and depositing a second gate material into the trench.

8. The method of claim 1, including implanting lightly doped source and drain regions into the active region after forming the lower gate level and before forming the upper gate level.

9. The method of claim 8, including implanting the lightly doped source and drain regions before removing the first photoresist layer.

10. The method of claim 8, including implanting the lightly doped source and drain regions after removing the first photoresist layer.

11. The method of claim 10, wherein implanting the lightly doped source and drain regions includes using the lower gate level as an implant mask that prevents essentially all ions impinging thereon from reaching the substrate.

12. The method of claim 10, wherein implanting the lightly doped source and drain regions includes implanting ions through the lower gate level into the substrate, thereby providing the IGFET as a depletion-mode device.

13. The method of claim 1, including implanting lightly doped source and drain regions into the active region using the upper gate level as an implant mask.

14. The method of claim 1, wherein the upper gate level has a substantially greater thickness than that of the lower gate level.

15. The method of claim 1, wherein the thickness of the first gate material is in the range of 500 to 1000 angstroms.

16. The method of claim 1, wherein the multilevel gate has a thickness of at least 2000 angstroms.

17. The method of claim 1, wherein the lower gate level is polysilicon.

18. The method of claim 1, wherein the upper gate level is selected from the group consisting of epitaxial silicon, polysilicon, conductive metals, and conductive metal silicides.

19. A method of making an IGFET with a multilevel gate, comprising the steps of:

providing a semiconductor substrate with an active region;

forming a gate insulator on the active region;

forming a polysilicon layer with a thickness of at most 1000 angstroms on the gate insulator and over the active region;

forming a first photoresist layer over the polysilicon layer;

irradiating the first photoresist layer with a first image pattern and removing irradiated portions of the first photoresist layer to provide openings above the active region;

etching the polysilicon layer through the openings in the first photoresist layer using the first photoresist layer as an etch mask for a portion of the polysilicon layer that forms a lower gate level;

removing the first photoresist layer;

depositing an insulating layer over the substrate and on the lower gate level after removing the first photoresist layer;

polishing the insulating layer so that a top surface of the lower gate level is exposed;

forming an upper gate level on the lower gate level after polishing the insulating layer, wherein the multilevel gate includes the upper and lower gate levels; and forming a source and drain in the active region.

20. The method of claim 19, wherein forming the upper gate level includes:

depositing a conductive material selected from the group consisting of polysilicon and conductive metals on the top surfaces of the lower gate level and the insulating layer;

forming a second photoresist layer over the conductive material;

irradiating the second photoresist layer with a second image pattern and removing irradiated portions of the second photoresist layer to provide openings above the active region;

etching the conductive material through the openings in the second photoresist layer using the second photoresist layer as an etch mask for a portion of the conductive material that forms the upper gate level; and removing the second photoresist layer.

21. The method of claim 20, wherein the second photoresist layer has a substantially greater thickness than that of the first photoresist layer.

22. The method of claim 20, wherein the first and second image patterns are essentially identical.

23. The method of claim 19, wherein forming the upper gate level includes selectively depositing epitaxial silicon on the lower gate level without depositing epitaxial silicon on the substrate.

24. The method of claim 19, wherein forming the upper gate level includes:

depositing a refractory metal on the top surfaces of the lower gate level and insulating layer without depositing the refractory metal on the substrate;

applying an anneal to react a portion of the refractory metal with the lower gate level to form a metal silicide as the upper gate level without forming metal silicide on the substrate; and removing an unreacted portion of the refractory metal on the insulating layer.

25. The method of claim 19, including implanting lightly doped source and drain regions into the active region after forming the lower gate level and before depositing the insulating layer.

26. The method of claim 25, including implanting the lightly doped source and drain regions before removing the first photoresist layer.

27. The method of claim 25, including implanting the lightly doped source and drain regions after removing the first photoresist layer.

28. The method of claim 19, wherein the thickness of the polysilicon layer is in the range of 500 to 1000 angstroms.

29. A method of making an IGFET with a multilevel gate, comprising the steps of:

providing a semiconductor substrate with an active region;

forming a gate oxide on the active region;

forming a polysilicon layer with a thickness in the range of 500 to 1000 angstroms on the gate oxide and over the active region;

forming a first photoresist layer over the polysilicon layer;

irradiating the first photoresist layer with an image pattern and removing irradiated portions of the first photoresist layer to provide openings above the active region;

etching the polysilicon layer through the openings in the first photoresist layer using the first photoresist layer as an etch mask for a portion of the polysilicon layer that forms a lower gate level;

removing the first photoresist layer;

depositing an insulating layer over the substrate and on the lower gate level after removing the first photoresist layer polishing the insulating layer so that a planar top surface of the lower gate level is exposed and substantially aligned with a planar top surface of the insulating layer;

depositing a conductive material on the top surfaces of the lower gate level and the insulating layer, wherein the conductive material has a substantially greater thickness than the polysilicon layer;

forming a second photoresist layer over the conductive material, wherein the second photoresist layer has a substantially greater thickness than that of the first photoresist layer;

irradiating the second photoresist layer with the image pattern and removing irradiated portions of the second photoresist layer to provide openings above the active region;

etching the conductive material through the openings in the second photoresist layer using the second photoresist layer as an etch mask for a portion of the conductive material that forms an upper gate level, wherein the multilevel gate consists of the upper and lower gate levels;

removing the second photoresist layer; and forming a source and drain in the active region.

30. The method of claim 29, wherein forming the source and drain includes:

implanting lightly doped source and drain regions into the active region outside the lower gate level before depositing the conductive material;

forming spacers adjacent to opposing sidewalls of the multilevel gate;

implanting heavily doped source and drain regions into the active region outside the multilevel gate and the spacers; and applying a high-temperature anneal.

31. The method of claim 19, wherein:

the image pattern defines a critical dimension; and a length of the lower gate level has substantially closer correspondence to the critical dimension than does a length of the upper gate level.

32. The method of claim 29, wherein the insulating layer is selected from the group consisting of silicon dioxide, silicon nitride, silicon oxynitride, and spin-on glass.

33. The method of claim 29, wherein the conductive material is selected from the group consisting of polysilicon and conductive metals.

34. A method of making an IGFET with a multilevel gate, comprising the steps of:

providing a semiconductor substrate with an active region;

forming a gate insulator on the active region;

forming a first gate material on the gate insulator and over the active region;

forming a first photoresist layer over the first gate material;

irradiating the first photoresist layer with a first image pattern and removing irradiated portions of the first photoresist layer to provide openings above the active region;

etching the first gate material through the openings in the first photoresist layer using the first photoresist layer as an etch mask for a portion of the first gate material that forms a lower gate level;

removing the first photoresist layer;

implanting a lightly doped drain region into the active region, wherein the lightly doped drain region is substantially aligned with a sidewall of the lower gate level;

forming an upper gate level on the lower gate level after removing the first photoresist layer and implanting the lightly doped drain region, wherein the multilevel gate includes the upper and lower gate levels;

implanting a heavily doped drain region into the active region, wherein the heavily doped drain region is substantially aligned with a sidewall of the upper gate level and substantially spaced from the sidewall of the lower gate level; and forming a source and drain in the active region, wherein the drain includes the lightly doped and heavily doped drain regions.

35. The method of claim 34, including:

depositing an insulating layer over the substrate and on the lower gate level after removing the first photoresist layer;

polishing the insulating layer until a top surface of the lower gate level is exposed; and then forming the upper gate level.

36. The method of claim 34, wherein forming the upper gate level includes:

depositing a second gate material over the substrate and on the lower gate level;

forming a second photoresist layer over the second gate material;

irradiating the second photoresist layer with a second image pattern and removing irradiated portions of the second photoresist layer to provide openings above the active region;

etching the second gate material through the openings in the second photoresist layer using the second photoresist layer as an etch mask for a portion of the second gate material that forms the upper gate level; and removing the second photoresist layer.

37. The method of claim 36, wherein the second photoresist layer has a substantially greater thickness than that of the first photoresist layer.

38. The method of claim 34 wherein forming the upper gate level includes:

depositing an insulating layer over the substrate and the lower gate level;

forming a trench partially through the insulating layer that exposes the lower gate level; and depositing a second gate material into the trench.

39. The method of claim 38, including polishing the second gate material until a portion of the second gate material in the trench is substantially aligned with a top surface of the insulating layer.

40. The method of claim 39, including removing a portion of the insulating layer outside the sidewall of the upper gate level after polishing the second gate material and before implanting the heavily doped drain region.

41. The method of claim 40, including removing a portion of the gate insulator outside the sidewall of the upper gate level after removing the portion of the insulating layer and before implanting the heavily doped drain region.

42. The method of claim 34, including implanting the lightly doped drain region using the lower gate level alone as an implant mask for the active region, and implanting the heavily doped drain region using the upper gate level alone as an implant mask for the active region.

43. The method of claim 34, including implanting a lightly doped source region into the active region simultaneously with implanting the lightly doped drain region, and implanting a heavily doped source region into the active region simultaneously with implanting the heavily doped drain region, wherein the source includes the lightly doped and heavily doped source regions.

44. The method of claim 34, wherein the lower gate level has a thickness of at most 1000 angstroms.

45. The method of claim 34, wherein the lower gate level has a thickness in the range of 500 to 1000 angstroms.

46. The method of claim 34, wherein the upper gate level has a substantially greater thickness than that of the lower gate level.

47. The method of claim 34, wherein the upper and lower gate levels are polysificon.

48. A method of making an IGFET with a multilevel gate, comprising the following steps in the sequence set forth:

providing a semiconductor substrate with an active region;

forming a gate insulator on the active region;

forming a polysilicon layer with a thickness of at most 1000 angstroms on the gate insulator and over the active region;

forming a photoresist layer over the polysilicon layer;

irradiating the photoresist layer with an image pattern and removing irradiated portions of the photoresist layer to provide openings above the active region;

etching the polysilicon layer through the openings in the photoresist layer using the photoresist layer as an etch mask for a portion of the polysilicon layer that forms a lower gate level;

removing the photoresist layer;

implanting lightly doped source and drain regions into the active region using the lower gate level alone as an implant mask for the active region, wherein the lightly doped source and drain regions are substantially aligned with opposing sidewalls of the lower gate level;

forming an upper gate level on the lower gate level, wherein the upper gate level has a substantially greater thickness than that of the lower gate level, opposing sidewalls of the upper gate level extend laterally beyond the opposing sidewalls of the lower gate level, and the multilevel gate includes the upper and lower gate levels; and implanting a heavily doped source and drain regions into the active region using the upper gate level alone as an implant mask for the active region, wherein the heavily doped source and drain regions are substantially aligned the opposing sidewalls of the upper gate level and substantially spaced from the opposing sidewalls of the lower gate level;

wherein a source includes the lightly doped and heavily doped source regions, and a drain includes the lightly doped and heavily doped drain regions.

* * * * *